US011323072B1

United States Patent
Kang et al.

(10) Patent No.: US 11,323,072 B1
(45) Date of Patent: May 3, 2022

(54) MIXER WITH SERIES CONNECTED ACTIVE DEVICES

(71) Applicant: HRL Laboratories, LLC, Malibu, CA (US)

(72) Inventors: Jongchan Kang, Moorpark, CA (US); Ara K. Kurdoghlian, La Canada, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 17/331,485

(22) Filed: May 26, 2021

Related U.S. Application Data

(60) Continuation of application No. 16/697,126, filed on Nov. 26, 2019, now Pat. No. 11,063,560, which is a division of application No. 15/637,286, filed on Jun. 29, 2017, now Pat. No. 10,523,156.

(51) Int. Cl.

| | | |
|---|---|---|
| *H04B 1/26* | (2006.01) | |
| *H03D 7/14* | (2006.01) | |
| *H03B 19/14* | (2006.01) | |
| *H03D 9/06* | (2006.01) | |
| *H04B 1/04* | (2006.01) | |

(52) U.S. Cl.
CPC ........... *H03D 7/1441* (2013.01); *H03B 19/14* (2013.01); *H03D 7/1458* (2013.01); *H03D 7/1466* (2013.01); *H03D 9/0675* (2013.01); *H04B 1/0475* (2013.01); *H03D 2200/0088* (2013.01)

(58) Field of Classification Search
CPC .. H03D 7/1441; H03D 7/1458; H03D 7/1491; H03D 7/163; H03D 7/1466; H03D 2200/0066; H03B 19/14; H04B 1/0475
See application file for complete search history.

(56) References Cited

U.S. PATENT DOCUMENTS

| | | | |
|---|---|---|---|
| 5,060,298 A * | 10/1991 | Waugh | H03D 7/1441 455/326 |
| 5,514,992 A | 5/1996 | Tanaka | |
| 6,138,000 A * | 10/2000 | Navid | H03D 7/1408 455/326 |
| 8,344,818 B1 | 1/2013 | Gamliel | |
| 8,401,512 B2 | 3/2013 | Buer | |
| 9,130,508 B1 | 9/2015 | Kang | |
| 9,634,658 B2 | 4/2017 | Ro | |
| 10,523,156 B2 | 12/2019 | Kang | |
| 11,063,560 B1 | 7/2021 | Kang | |
| 2004/0121751 A1 | 6/2004 | Shen | |
| 2005/0043003 A1 | 2/2005 | Abdelli | |
| 2005/0215215 A1* | 9/2005 | Shemesh | H03D 7/1466 455/209 |
| 2007/0224964 A1 | 9/2007 | Kwon | |

(Continued)

OTHER PUBLICATIONS

From U.S. Appl. No. 16/697,126 (now U.S. Pat. No. 11,063,560), Notice of Allowance dated Mar. 8, 2021.

(Continued)

*Primary Examiner* — Tuan Pham
(74) *Attorney, Agent, or Firm* — Ladas and Parry

(57) ABSTRACT

A unit cell for a resistive mixer includes a plurality of active devices arranged in series, wherein each of said plurality of active devices having a different output conductance. A resistive mixer includes a plurality of active devices connected in series with one another to form a unit cell.

4 Claims, 11 Drawing Sheets

(56) References Cited

U.S. PATENT DOCUMENTS

| | | | |
|---|---|---|---|
| 2007/0247212 | A1 | 10/2007 | Zhang |
| 2008/0020728 | A1 | 1/2008 | Zhuo |
| 2008/0068082 | A1 | 3/2008 | Otaka |
| 2009/0082691 | A1 | 3/2009 | Denison |
| 2011/0092178 | A1 | 4/2011 | Wang |
| 2014/0152371 | A1 | 6/2014 | Goel |
| 2017/0141730 | A1 | 5/2017 | Wang |
| 2018/0123523 | A1 | 5/2018 | Vujcic |

OTHER PUBLICATIONS

From U.S. Appl. No. 16/697,126 (now U.S. Pat. No. 11,063,560), Office Action dated Jan. 7, 2021.
Extended European search report from EPO Patent Application No. 18844500.1 dated Dec. 10, 2020.
From U.S. Appl. No. 15/637,286 (now published as U.S. Pat. No. 10,523,156), Notice of Allowance dated Aug. 28, 2019.
From U.S. Appl. No. 15/637,286 (now published as U.S. Pat. No. 10,523,156), Office Action dated Jun. 18, 2019.
From U.S. Appl. No. 15/637,286 (now published as U.S. Pat. No. 10,523,156), Office Action dated Jan. 30, 2019.
From U.S. Appl. No. 15/637,286 (now published as U.S. Pat. No. 10,523,156), Office Action dated Dec. 7, 2018.
Garcia, J. A., "Resistive FET mixer conversion loss and IMD optimization by selective drain bias", Microwave Symposium Digest, IEEE MTT-S International vol. 2, pp. 803-806, 1999.
Kim, J., "Intermodulation Analysis of Dual-Gate FET Mixers", IEEE Transactions on Microwave Theory and Techniques, vol. 50, Issue 6, Jun. 2002.
PCT International Search Report and Written Opinion from PCT/US18/039594 dated Mar. 4, 2019.
PCT International Preliminary Report on Patentability (Chapter II) from PCT/US18/039594 dated Aug. 12, 2019.
Office action from EPO Patent Application No. 18844500.1 dated Mar. 10, 2022.

\* cited by examiner

MIXER WITH SERIES CONNECTED ACTIVE DEVICES

CROSS REFERENCE TO RELATED APPLICATIONS

This application is a continuation of U.S. patent application Ser. No. 16/697,126 filed on Nov. 26, 2019 which in turn is a division of U.S. patent application Ser. No. 15/637,286 filed on Jun. 29, 2017 which application is incorporated herein as though set forth in full.

STATEMENT REGARDING FEDERALLY SPONSORED RESEARCH OR DEVELOPMENT

This invention was made with Government support under Contract No. N00014-11-C-0127 awarded by ONR (Office of Navy Research) STAR. The Government has certain rights in the invention.

BACKGROUND

In communication systems there is often a need to shift a signal from one frequency band to a different frequency band, with very little or preferably no distortion occurring. This frequency shifting is done by a device or circuit called a mixer. The mixer typically generates the signal in a new frequency band (often called the Intermediate Frequency signal or IF signal when the mixer is used in a radio receiver) from the original signal (often called the Radio Frequency signal or RF signal when the mixer is used in a radio receiver) using an unmodulated signal (often called the Local Oscillator frequency or LO when the mixer is used in a radio receiver).

Mixers come in several forms, but they typically rely on well known non-linearities to achieve the desired mixing. Unfortunately, those non-linearities can also give rise to undesirable intermodulation distortion. A lot of the technical literature with respect to mixers discuss about how to take advantage of the non-linearities to achieve the desired mixing while reducing the unwanted intermodulation distortion.

In a typical mixer, a down-converted Intermediate Frequency ("IF") signal is derived which is a nonlinear harmonic product of Radio Frequency ("RF") and Local Oscillator ("LO") signals. A typical mixer uses a device's non-linearity to achieve the mixing. Because of this, achieving highly linear mixer is challenging, especially for a large third order input intercept point ("IIP3").

IIP3 is a figure of merit used in describing the linearity of many circuits, including mixers. IIP3 is determined by finding the intersection of a plot of the output power versus the input power for a first order term of the Taylor series expansion of the circuit transfer function and a plot of the third order term of the series expansion for the circuit transfer function. The third order distortion products are undesirable, so the bigger the ratio, the better (less distorted) the circuit being analyzed. So a higher IIP3 is better than a lower IIP3.

Mixers can also have a conversion loss which is defined as the ratio of the power of the signal in the new frequency band (typically the signal at the IF frequency) to the power of the original signal in the original frequency band (typically the signal at the RF frequency). If the mixer has a built in amplifier, then it can exhibit a conversion gain.

Mixers are often called resistive mixers when transistors are operated under turned-off DC bias condition to achieve the desired frequency mixing. When one or more Field Effect Transistors (FETs) are utilized in a resistive mixer, it is the non-linearities in the channel conductance of the one or more 1-ETs which are utilized to achieve frequency mixing.

To reduce and/or minimize conversion loss and maximize IIP3 (to lower third order distortion products), the mixer must be very linear during the intermodulation of RF frequencies and sufficiently non-linear during the intermodulation of RF and LO frequencies to achieve the desired mixing of the RF and LO frequencies.

A typical balanced (or double balanced) resistive microwave mixer uses one device at one stage and usually contains matching components (such as micro-strip line or capacitors) to try to obtain the best conversion loss with reasonable linearity.

Typically, when a linear resistive mixer is designed, each unit cell has one transistor and its size and gate bias are adjusted to try to obtain the best linearity performance along with matching condition. However, since there is trade-off relationship between IIP3 and conversion loss in this approach, better IIP3 cannot typically be achieved without sacrificing conversion loss.

In some cases, selective drain bias can be applied to utilize device output conductance as described in J. A. Garcia, J. C. Pedro, M. L. De la Fuente, N. B. Carvalho, A. Mediavilla, and Tazon, A., "Resistive FET mixer conversion loss and IMD optimization by selective drain bias." Microwave Symposium Digest, IEEE MTT-S International Volume: 2 (1999) and in J. Kim and Y. Kwon, "Intermodulation analysis of dual-gate FET mixers," Microwave Theory and Techniques, IEEE Transactions on Volume: 50, Issue: 6 (2007). However, their resulting IIP3 may still be limited and a more complex layout may be required.

SUMMARY

An aspect of the technology relates to a unit cell, wherein a mixer may comprises a plurality of such unit sells, each unit cells including a plurality of active devices arranged in series, wherein each of said plurality of active devices have a different size (gate width, for example). Another aspect of the technology relates to a resistive mixer, comprising a plurality of active devices connected in series with one another to form a unit cell, the plurality of active devices connected in series with one another to form a unit cell having different conductances and capacitances.

The unit cell as described above, wherein the plurality of active devices have different size gate widths.

The unit cell as described above, wherein the size ratio of the active devices is 1:2 (IF side:RF side).

The unit cell as described above, wherein the size ratio of the active devices is between 1:1 and 1:4 (IF side:RF side).

The unit cell as described above, wherein the plurality of active devices are arranged in series to suppress a non-linear third harmonic of an RF signal. The unit cell as just described, wherein the series arrangement comprises a first active device drain connected to a second active device source.

The unit cell as described above, wherein a first active device source is connected to an first frequency source and a second active device drain is connected to a second frequency output and gates of the first and second active device are connected in common to a third frequency input. The unit cell as just described, wherein the gates of the active devices are connected to a local oscillator and have a common DC gate bias voltage.

The unit cell as just described, wherein half of the gates of the plurality of active devices receive a 180 degrees out of phase local oscillator signal.

The unit cell as described above, wherein one or more of the plurality of active devices comprises one or more from the group consisting of HEMTs, CMOSs, FETs and BJTs.

In another aspect the present invention involves a mixer, comprising: a plurality of unit cells each comprising a plurality of active devices of different sizes arranged in series to reduce a generation of a non-linear third harmonic by a mixer in which the plurality of unit cells are arranged. The unit cell as just described, wherein a size ratio of the active devices is 1:2 (IF side:RF side). The unit cell as just described, wherein a size ratio of the active devices is 1:4 (IF side:RF side). The unit cell as just described, wherein the plurality of active devices are arranged in series in the mixer. The unit cell as just described, wherein the series arrangement comprises a first active device drain connected to a second active device source. The unit cell as just described, wherein a first active device source is connected to an intermediate frequency and a second device drain is connected to a radio frequency. The unit cell as just described, wherein gates of the plurality of active devices are connected to a local oscillator with the same DC gate bias voltage. The unit cell as just described, wherein half of the gates of the plurality of active devices receive a 180 degrees out of phase local oscillator signal. The unit cell as just described, wherein a single balanced resistive mixer includes two unit cells, a double balanced resistive mixer includes four unit cells and a double-doubly balanced mixer includes eight unit cells.

In another aspect the present invention relates to an apparatus for reducing a third harmonic generated by a mixer, the mixer comprising a plurality of unit cells, the unit cells being connected in a ring of unit cells having an RF input, a LO input and an IF output, the apparatus comprising: at least a pair of active devices in each of said unit cells, each of said pair of active devices having a pair of current carrying electrodes and at least one control electrode; a first circuit connecting the at least a pair of active devices in each of said unit cells so that said current carrying electrodes of the active devices in each unit cell are coupled in series with each other and also connected to current carrying terminals of neighboring unit cells in said ring of unit cells; a second circuit connecting the at least a pair of active devices in each of said unit cells so their control electrodes are coupled in parallel with each other and also connected to said LO input; and wherein sizes of at least one semiconductor element in each of the pair of active devices in each of said unit cells being differently sized relative to each other in said unit cells.

In another aspect the present invention relates to a method for producing a unit cell in a mixer, the method comprising: providing a plurality of active devices of different sizes connected in series.

BRIEF DESCRIPTION OF THE DRAWINGS

FIG. 1b is an equivalent circuit for FIG. 1a.
FIG. 2a is a circuit diagram of active devices connected in series in a unit cell while
FIG. 2b is schematic of an equivalent circuit for that of FIG. 2a.

FIG. 9b presents an equivalent circuit to that of FIG. 9a.

DETAILED DESCRIPTION

Figure 1:
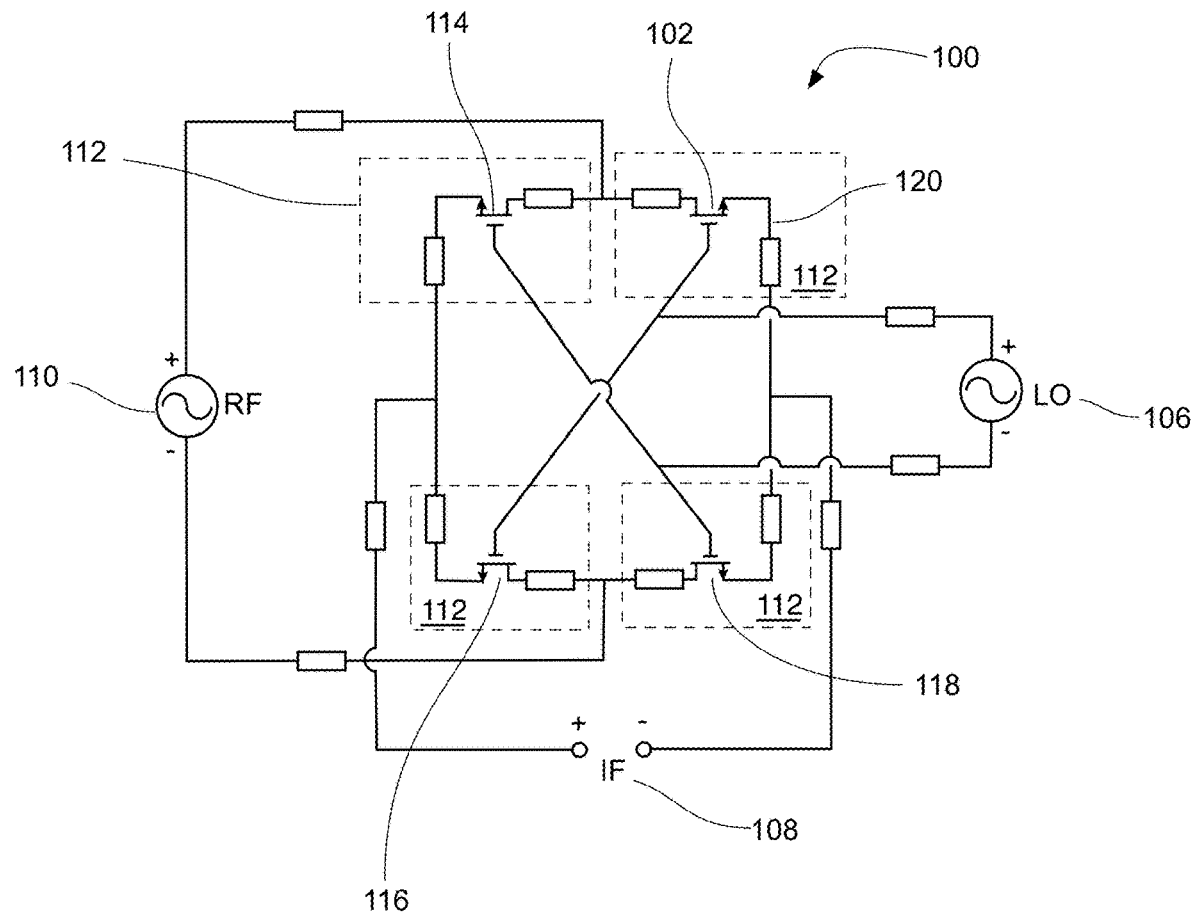
FIG. 1 is a circuit diagram of a typical prior art mixer.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112(f). In particular, the use of "step of" or "act of" in the claims herein is not intended to invoke the provisions of 35 U.S.C. 112(f).

The present technology relates to an apparatus, system, and method for making the same, related to a mixer with series-connected active devices. Each apparatus, system and method may include one or more embodiments in any combination. The features of any embodiment may be used in combination with any other embodiment.

Mixer linearization involves minimizing certain unwanted harmonics while maximizing other wanted harmonics. Under 2-tone RF signal ($F_{rf1}$ and $F_{rf2}$) injection, a mixer's IF signal frequency is defined by $F_{LO}-F_{RF}$, (where $F_{RF}$ is $F_{rf1}$ or $F_{rf2}$) and an IF third harmonic frequency (IF3) defined by $(2*F_{rf1}-F_{rf2})-F_{LO}$ or $(2*F_{rf2}-F_{rf1})-F_{LO}$. Accordingly, from this relationship, it is understood that the IF third harmonic is the down-converted RF third harmonic by $F_{LO}$. The conversion loss is defined by $P_{RF}-P_{IF}$, where $P_{IF}$ denotes power at IF frequency and $P_{RF}$ denotes power at RF frequency. IIP3 is defined as $P_{RF}+0.5*(P_{IF}-P_{IF3})$, wherein $P_{IF3}$ denotes power of IF3 signal frequency defined by $(2*F_{rf1}-F_{rf2})-F_{LO}$ or $(2*F_{rf2}-F_{rf2})-F_{LO}$.

Some typical microwave resistive mixers (including single-balanced and double balanced types) may utilize single transistors, while other typical resistive mixers may use dual-gate transistors as their basic units. In either of these designs, conversion loss or IIP3 may be optimized, typically by adjusting transistor sizes, bias conditions along with microwave matching using, for example, micro-strip lines and lumped components such as capacitors and inductors. In most such microwave resistive mixer designs, there can be a tradeoff between conversion loss and IIP3. Accordingly, it can be challenging to achieve very good conversion loss and IIP3 at the same time using these conventional mixer design techniques. For example, although increasing device sizes or using HEMTs with higher gate bias may lower conversion loss, this can be accompanied by a lower, less desirable IIP3.

FIG. 1 shows a typical, prior art, standard double balanced-resistive mixer 100. In the typical standard double balanced-resistive mixer design, each unit cell 112 usually has a single transistor 102, 114, 116 or 118 whose size and gate bias are adjusted to achieve the best linearity performance along with matching condition. However, since there is trade-off between IIP3 and conversion loss in this approach, it may be difficult to achieve a better (i.e. higher) IIP3 without sacrificing conversion loss.

In some cases, selective drain bias can be applied to utilize device output conductance; but the resulting IIP3 may still be limited and the layout may be more complex. See, as examples, devices described by J. A. Garcia, J. C. Pedro, M. L. De la Fuente, N. B. Carvalho, A. Mediavilla, and Tazon, A., in "Resistive FET mixer conversion loss and IMD optimization by selective drain bias," Microwave Symposium Digest, IEEE MTT-S International Volume: 2 (1999) and by J. Kim and Y. Kwon, in "Intermodulation analysis of dual-gate FET mixers," Microwave Theory and Techniques, IEEE Transactions on Volume: 50, Issue: 6 (2007). Both of these documents are incorporated by reference herein.

As shown in FIG. 1, a conventional standard double balanced resistive mixer 100 typically can include HEMTs 102, 114, 116 and 118, each of which forms or is in a typical unit cell or transistor block 112. So the mixer 100 of FIG. 1 has four unit cells or transistor blocks 112. The typical prior art unit cell or transistor block 112 has only a single active device therein. Connected to the gate of each of the four HEMTs 102, 114, 116 and 118 is a Local Oscillator (LO) 106, which provides the same unmodulated signal to the gate of each of the HEMTs, except that the signal to HEMTs 114 and 118 is 180 degrees out-of-phase with respect to the LO signal provided to HEMTs 102 and 116. The source of each of the four HEMTs, 102, 114, 116 and 118, provide an IF output 108, whereas the drain of each of the four HEMTs, 102, 114, 116 and 118 are connected to a RF input 110.

In a typical arrangement, the typical double balanced resistive mixer 100 usually relies on linearity during intermodulation of two RF frequencies and sufficient non-linearity during the intermodulation of RF and LO frequencies to reduce and/or minimize conversion loss and maximize IIP3. In such a typical microwave mixer, a down converted IF signal is the nonlinear harmonic product of RF and LO signals. This typically means that the mixer relies on device non-linearity to generate the IF signal. Accordingly, achieving a highly linear mixer is challenging, especially for IIP3.

The unlabeled rectangles connote the use of micro-strips which are advantageous at microwave frequencies.

Figure 1A:
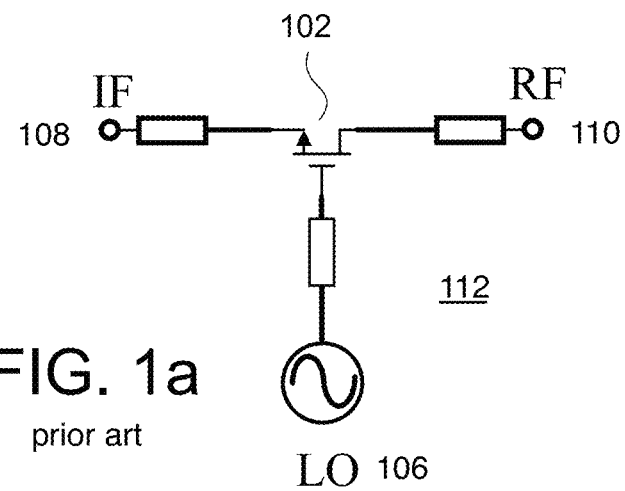
FIG. 1a is a simplified representation of the mixer in FIG. 1
Figure 1B:
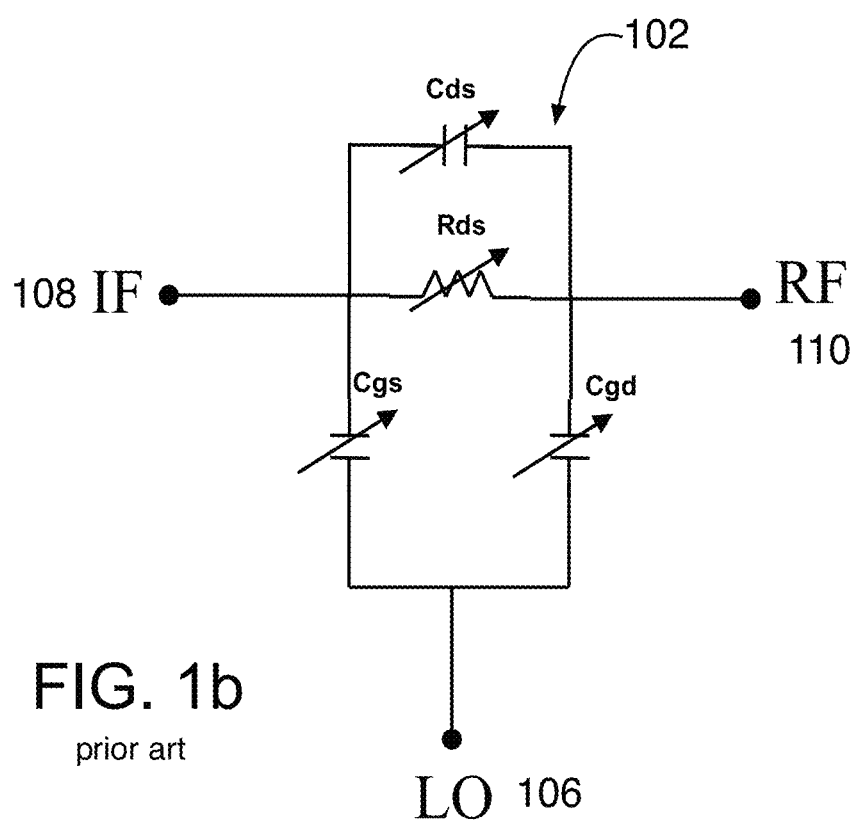

FIG. 1a depicts a conventional single unit cell or transistor block 112. In this case, a Field Effect Transistor (FET) is labeled with the numeral 102, but it could have been labeled instead with the numerals 114, 116 or 118. FIG. 1b depicts an equivalent diagram. The resistive FET mixer of FIG. 1a can be described equivalently with the circuit schematic of FIG. 1b, which circuit consists of output resistance (Rds), output capacitance (Cds), gate source capacitance (Cgs) and gate drain capacitance (Cgd), which are all non-linear. Output conductance is thus equal to 1/Rds. An ideal resistive FET mixer assumes only non-linear output conductance for the IF to RF up-conversion or RF to IF down conversion by LO, excluding other non-linear capacitances. Under the down-conversion assumption with 2-tone RF signal (Frf1 and Frf2) injection, a mixer's IF signal frequency is defined by $F_{LO}-F_{RF}$, (where $F_{RF}$ is Frf1 or Frf2) and an IF third harmonic frequency (IF3) defined by $(2*F_{rf1}-F_{rf2})-F_{LO}$ or $(2*F_{rf2}-F_{rf1})-F_{LO}$. Accordingly, from this relationship, it is understood that the IF third harmonic is the down-converted RF third harmonic by $F_{LO}$. The conversion loss is defined by $P_{RF}-P_{IF}$, where $P_{IF}$ denotes power at IF frequency and $P_{RF}$ denotes power at RF frequency. IIP3 is defined as $P_{RF}+0.5*(P_{IF}-P_{IF3})$, wherein $P_{IF3}$ denotes power of IF3 signal frequency defined by $(2*F_{rf1}-F_{rf2})-F_{LO}$ or $(2*F_{rf2}-F_{rf1})-F_{LO}$. As explained, non-linear output conductance itself, makes the signal down-conversion as well as the IF third harmonic. Once non-linear capacitances are all considered together, all non-linear capacitances generate third harmonics along with non-linear output conductance and resulting IIP3 becomes worse than in the ideal resistive mixer case.

Figure 2A:
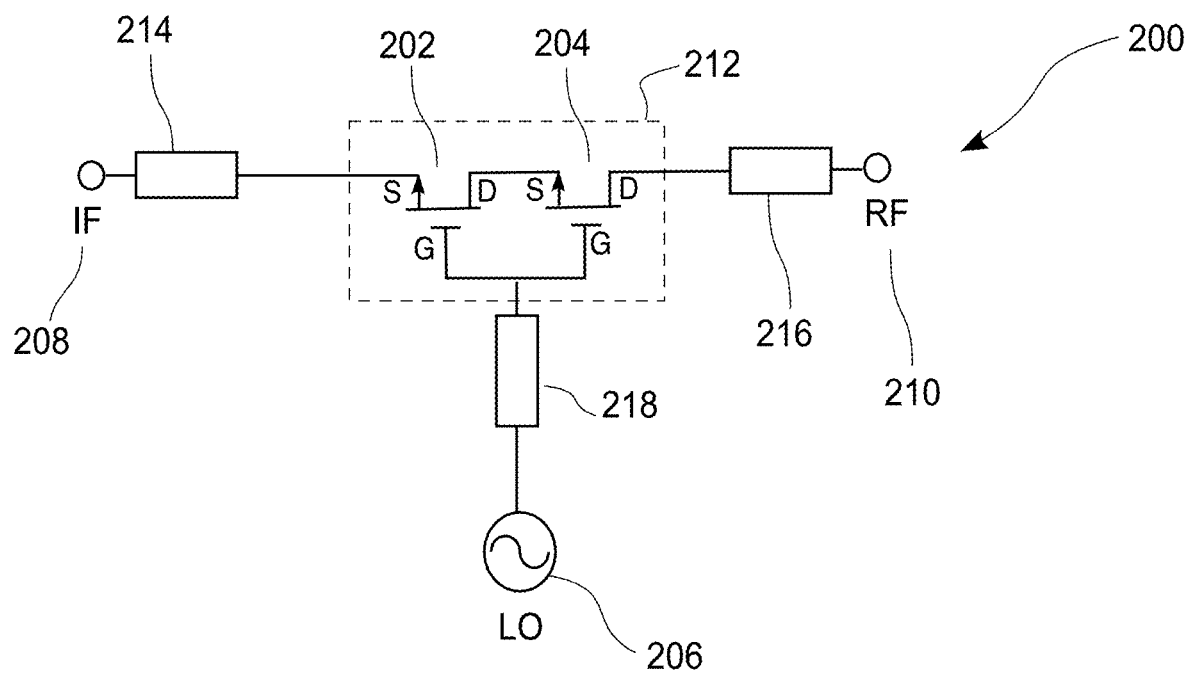

FIG. 2a shows an embodiment of a unit cell in accordance with present disclosure where a plurality of active devices (preferably two active devices such as HEMTs 202 and 204) is arranged in series in a new design unit cell 212. The new design unit cell 212 can replace the prior unit cell 112 and an improved mixer can result. A mixer usually has a number of unit cells, such as the four unit cells 112 of the prior art mixer of FIG. 1. It is to be noted that the unit cell 212 of FIG. 2a is different from the prior art unit cell 112 in that it has a plurality of (at least two) separate active devices, namely, FETs 202 and 204. The plurality of active devices (here 202 and 204) within the new design unit cell 212 are preferably connected in series with each other. FETS 202 and 204 may be n-channel devices (arrow away from the gate) or p-channel devices (arrow towards the gate). In addition, FETS 202 and 204 may both be enhancement mode devices or both depletion mode devices. Without implying a limitation, FETS 202 and 204 may be HEMTs, JFETs, MESFETs, and/or CMOS devices including hybrid devices.

FIG. 2a discloses first and second active devices 202 and 204, respectively, connected in series with each other to form a new design unit cell 212. The gate of the first and second active devices 202 and 204 are preferably electrically connected in phase to a local oscillator (LO) source 206 (preferably via a micro-strip 218 when used at microwave frequencies) so that each gate in a new design unit cell 212 receives the same signal with same phase thereof from the local oscillator 206. The drain of the first active device 202 can, in a preferred embodiment, be connected to the source of the second active device 204, to form a series connection between them. The drain of any active device directly connected to the source of another active device may be referred to as an inner drain, and the source of the another active device may be referred to as an inner source. The source of the first active device 202 may be connected to IF (preferably via a micro-strip 214 when used at microwave frequencies), and the drain of the second active device 204 can be connected to the RF (preferably via a micro-strip 216 when used at microwave frequencies). The source of any active device connected to the IF connection and may be referred to as an outer source, and the drain of any active device connected to the RF connection may be referred to as an outer drain. Alternatively, in some embodiments (not shown), the source of the first active device 202 may be connected to RF, and the drain of the second active device 204 can be connected to IF.

Figure 2B:
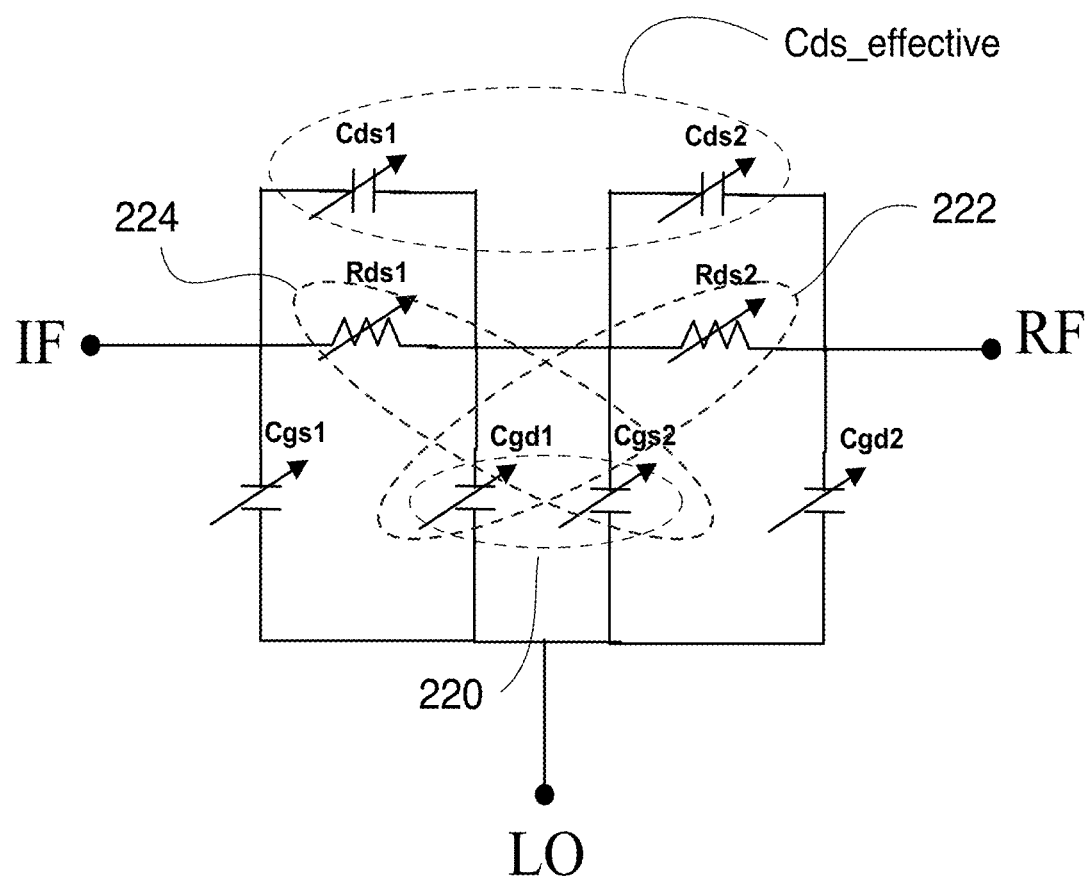

FIG. 2b is an equivalent circuit diagram to that of FIG. 2a and the nomenclature generally follows that of FIG. 1b except that here two series-connected transistors in the unit cell 212 and therefore the numerals 1 and 2 have been added to the various capacitances and resistances compared to FIG. 1b.

Figure 6:
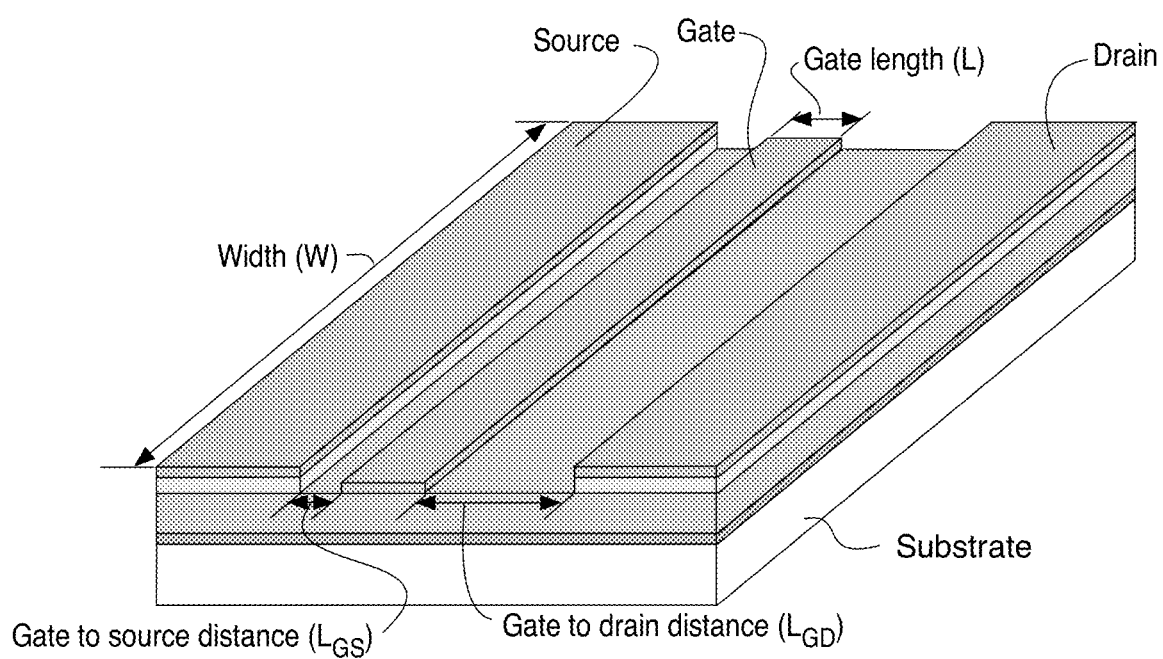
FIG. 6 is an illustration of a 1-ET device (such as a HEMT) showing how gate width (W) and length (L) are defined.

With two FETs connected in series, the equivalent circuit model appears in FIG. 2b. Because of the two FETs 202, 204 being in series connection, Cds1 and Cds2 are also in series connection, so their effective capacitance (Cds_effective) is thereby reduced and the third harmonic generation from Cds_effective is reduced compared to a single FET unit cell 112 resistive mixer as used in the prior art of FIG. 1. If the two FETs 202, 204 are identically sized (so that they both have the same gate width W—see FIG. 6), the non-linear behavior of Cgd1 and Cgs2 would be almost or basically the same (see loop 220).

On the other hand, if the FET structures of FETs 202, 204 take on a non-symmetric shape so that the gate is closer to the source than it is to the drain (i.e. a relatively long drain to gate distance ($L_{GD}$—see FIG. 6) and relatively short source to gate distance ($L_{GS}$—see FIG. 6) like a Field-plate GaN HEMT or LDMOS), then, the Cgd1 and Cgs2 non-linear harmonic generation mechanisms are significantly different and their non-linear third harmonics can be cancelled out by adjusting the device width (W—see FIG. 6) ratio, resulting in better linearity (better IIP3). Similarly, with a series connection of two 1-ETs (regardless symmetric or non-symmetric gate to drain Lgd or gate to source Lgs), more chances for nonlinear harmonic cancellation can occur between Cgd1 and Rds2 (see loop 222 on FIG. 2b), Cgs2 and Rds1 (see loop 224 on FIG. 2b), Cgd1 and Cgs2 (see loop 220 on FIG. 2b). Since equation based non-linear components modeling and analysis is very complex and varies depending on what kind of device, device structure and/or device manufacturing process is used, it is easier to determine a best (or suitable) optimized size width W ratio of the two FETs through circuit simulation or trial and error.

Since the series connection of the FETs does not increase the output capacitance at the IF connection or the input capacitance at the RF connection, this improved circuit can maintain the same bandwidth as the single FET prior art embodiment of FIG. 1b, but exhibiting a better IIP3. In other words, the is no need to compromise improvement in IIP3 by a reduction in operating bandwidth when two or more series connected active devices replace the single active device cell 112 found in the prior art of FIG. 1a.

A series connection of Bipolar Junction Transistor (BJT) devices (see FIGS. 9a and 9b) can also provide the similar linearity improvement with different device sizes. For BJT's the device size ratio is based on the areas of the emitters whereas for FETs the device size ratio is based on gate widths. So in the case of a BJT embodiment, the BJT connected to the RF side of the mixer is the larger device. Preferred ratios of the BJT emitter area on the RF side to the emitter area of the BJT on the IF side range from 1:1 to 4:1 with 2:1 being preferred.

In some embodiments, the active devices 202 and 204 may comprise one or more high-electron mobility transistors, or HEMTs. In other embodiments, other transistor types, such as CMOS FETs or Bipolar Junction Transistors (BJTs), may be used as the active devices 202 and 204 with similar termination. See FIGS. 9a and 9b for a BJT embodiment. In some embodiments, active device 202 can be a different type of transistor than active device 204, for example, or can be the same type of transistor.

With active devices 202 and 204 having different sizes, the output conductances and capacitances of each active device can differ from the other one or more active devices within the same unit cell such that each generated RF third order harmonic from each output conductance and capacitance can effectively be cancelled out, reduced or minimized within the unit cell or between 180 degree out-phased two unit cells in a balanced structure. In a resistive mixer, signal mixing and harmonic generation can be achieved through non-linear output conductance and capacitances. The two series active devices 202 and 204 may be selected/configured to have size ratio (IF side:RF side) between 1:4 and 1:1. A preferred size ratio is 1:2. The size ratio for FETs (including transistors which are FET based such as HEMTs, etc.) is based on the ratio of the gate width (W) of device 202 divided by the gate width of device 204 in FIG. 2a using the definition for gate width (W) of FIG. 6. The active devices 202 and 204 within a unit cell 212 are preferably connected to the same DC gate bias voltage fed through a RF choke resistor or inductor (not shown), utilizing biasing techniques known to those skilled in the art.

Figure 3:
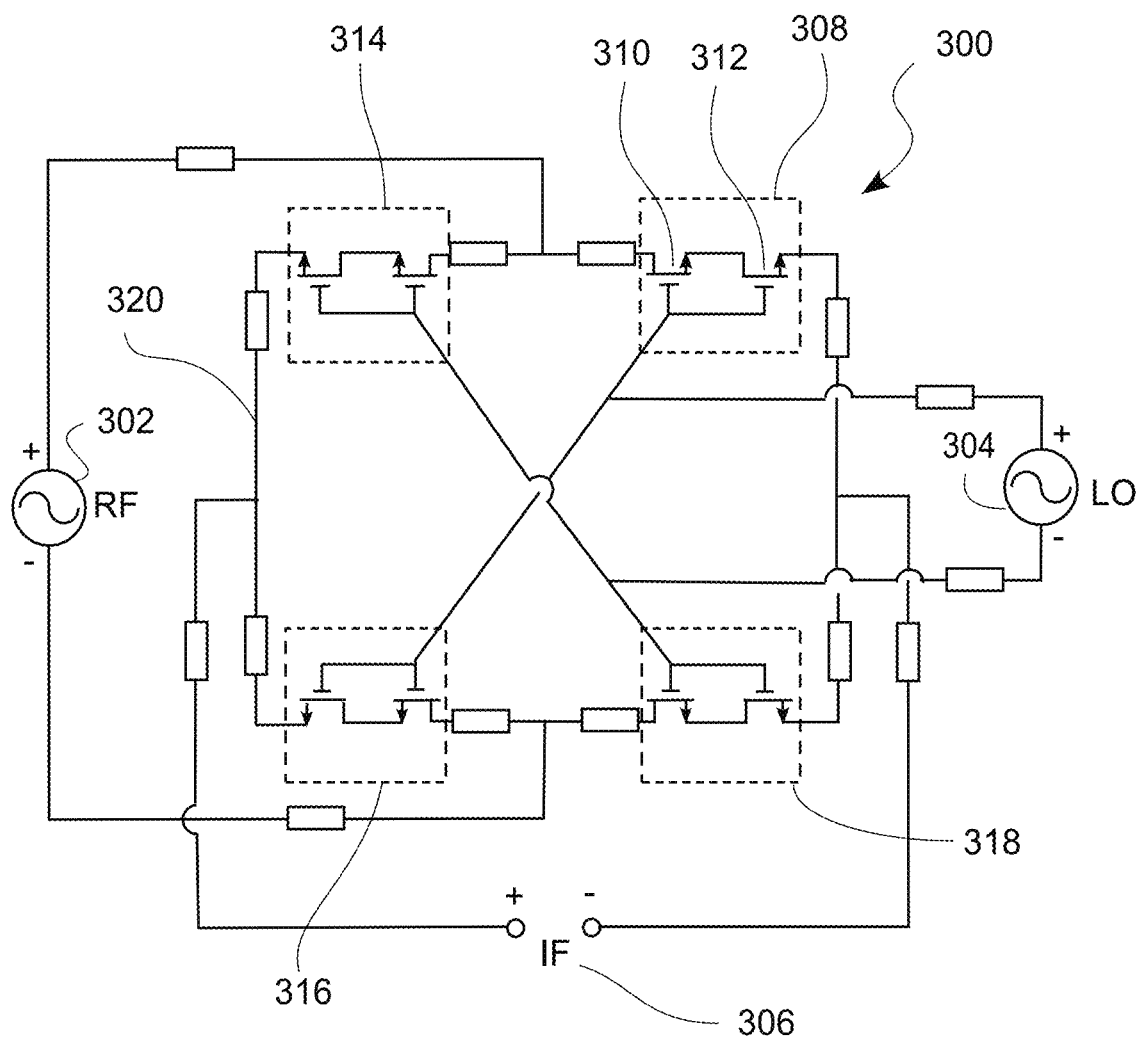
FIG. 3 is a circuit diagram of a mixer with series transistors.

In some embodiments, one or more of the new unit cells 212 can be arranged in a Resistive Microwave Mixer ("RMM") design. Preferably, four unit cells 212 may be arranged as a double balanced resistive mixer 300 as shown in FIG. 3. FIG. 3 illustrates a double balanced resistive mixer 300 that includes four unit cells 212 (individually numbered 308, 314, 316 and 318 in this figure), each having two active devices (preferably series connected FETs or HEMT type FETs). Accordingly, a plurality of unit cells 212 may be arranged in the double balance resistive mixer 300. More or fewer unit cells can be included in a resistive mixer design. Alternative embodiments of double balance resistive mixers are not illustrated, but the use of the new design unit cells 212 disclosed herein is certainly contemplated.

Turning now to the resistive mixer 300 shown in a preferred embodiment at FIG. 3, each of the enumerated unit cells 308, 314, 316 and 318 includes a plurality of active devices arranged in series with each other and, except for the numbering utilized, they are otherwise preferably the same as unit cell 212 of FIG. 2a. For example, unit cell 308 includes active devices 310 and 312 connected in series with each other. Although two active devices are shown, the unit cells 308, 314, 316 and 318 or any other unit cell in other embodiments can include additional active devices, which may be added in pairs. The other unit cells 314, 316, and 318 can be arranged or configured preferably to similarly include a plurality of active devices arranged in series or other arrangements. In some embodiments, the active devices of a unit cell are different sizes so as to have a size ratio.

As shown in FIG. 3, the gates of all active devices in the unit cells 308, 314, 316 and 318 can be connected preferably to a LO frequency source 304 and thereby receive the same signal, though the active devices of unit cells 314 and 318 receive the signal 180 degree out-of-phase with respect to the active devices of unit cells 308 and 316. Each of the plurality of active devices can take the same gate bias voltage or different bias voltages.

The outer source of each of the plurality of unit cells (308, 314, 316, 318) can be connected preferably to IF 306 and the outer drain of each of the plurality of unit cells (308, 314, 316, 318) can be connected preferably to a RF input 302. Within the unit cells, 308, 314, 316 and 318, the inner source of an active device is connected to the inner drain of another active device. Resistive elements may be arranged between each of the active devices and the corresponding IF, RF and LO ports, of a preferred embodiment.

The active devices 310 and 312 in series of a preferred embodiment, as shown for example in unit cell 308, may be arranged or configured within the unit cell such that the unit cell has an IF-side active device and an RF-side active device. In such an embodiment, in unit cell 308, active device 310 can be arranged in series with active device 312 such that the active device 310 may be considered an RF-side active device and active device 312 may be considered an IF-side active device due to their connections to RF 302 and IF 306, respectively.

The series connection of two active devices in all of the series connection embodiments can improve mixer linearity (IIP3) through adjusting the size ratio between the two active devices. Selecting proper device size ratio can improve the output conductance and capacitances between two devices and cancel out, or at least reduce, non-linear third harmonics, as the result of that selection as is explained herein. Thus, output conductance and capacitances are dependent on device size, with a bigger device having a bigger output conductance and capacitance. As noted earlier, determination of the size ratio may depend on the type of active devices employed. To achieve the best IIP3, non-linear harmonic cancellation is realized from two different output conductances and capacitances. An optimum size ratio of the IF-side active device to the RF-side active device, in some embodiments, is between 1:1 and 1:4. For FETs, the size ratio is based on the gate widths of the FETs. For bipolar transistors, the size ratio is based on the emitter areas.

As shown in FIG. 3, in some embodiments, each unit cell 308, 314, 316 and 318 includes two series active transistors. In some embodiments each of the unit cells have the same conductance. In other embodiments, the transistors can be of any type, including, but not limited to HEMTs, each of whose outer ends (drain and source) may be connected to RF 302 and IF 306, respectively. A LO 304 produced signal can be provided through the two gates at the same phase. The two series active devices 310 and 312, shown for example in unit cell 308, may be selected/configured preferably to have size ratio (IF side:RF side) in a range between 1:2 and 1:4.

Although four unit cells are shown in FIG. 3, additional unit cells may be included in a similar configuration. In some embodiments, additional pairs of unit cells may be included. This can provide a balanced mixer having two unit cells, a double balanced mixer having four unit cells, a double-doubly balanced mixer having eight unit cells, or any other mixer with additional pairs of unit cells. In any of these configurations the larger size device is on the RF side and the smaller size device is on the IF side Using FIG. 2 as an example, one embodiment is a method for providing a unit cell having a plurality of active devices arranged in series, with each of said plurality of active devices having a different output conductance. In another embodiment, the method can optionally include providing a plurality of active devices of different sizes. The size ratios can optionally be, in some embodiments, between 1:1 (IF side:RF side) to 1:4 (IF side:RF side) with 1:2 (IF side:RF side) preferred. The method can optionally include arranging the active devices in series to suppress a non-linear third harmonic of an RF signal. The method can optionally include, as shown in FIG. 2, connecting a first active device 202 drain to a second active device 204 source. The method can optionally include connecting a first active device 202 source to an IF and a second active device 204 drain to a RE The method can optionally include connecting gates of the plurality of active devices, 202 and 204, to a LO to have the same DC gate bias voltage. Half of the gates of the plurality of active devices, 202 and 204, receive a 180 degrees out of phase local oscillator signal. As further shown in FIGS. 3, 308 and 316 will be 180 degrees out of phase with 314 and 318, as further exemplified by RF, LO and IF ports each having "+" and "−" signs connoting in typical circuitry convention the 180 degree phase difference. Any devices connecting to a "+" sign have 180 degree phase difference with "−" connecting devices.

In other embodiments, the method employs a HEMT, CMOS and/or BJT as one or more of the plurality of active devices.

In still other embodiments, the shunt resistors for gate bias (not shown) can be replaced with choke inductors. Inductors are preferred when the devices 202 and 204 are BJT instead of FETs to minimize DC power loss.

Embodiments according to the principles of the preset invention were simulated with GaN HEMTs. For comparison, the standard prior art mixer design of FIG. 1 was also optimized for the best conversion loss and IIP3.

A double balanced resistive mixer architecture was chosen since it can typically deliver wide broadband signal within the microwave frequency range and is a widely used architecture for communications. In this simulation, the design used all MMIC devices.

In one example, the simulated resistive double balanced mixer design according to the present invention using GaN HEMTs shows 5 to 15 dB IIP3 improvement compared with a standard prior art resistive double balanced mixer, without sacrificing conversion loss for example. FIG. 1 and FIG. 3 show the respective schematics of the standard prior art resistive double balance mixer and the double-balanced resistive mixer according to the present invention.

The simulation employed 102 device sizes of 720 um gate length for standard prior art mixer and 420 um and 840 um (gate lengths of devices 312 and 310, respectively in each unit cell 308, 314, 316, and 318. Since a double-balanced architecture was employed, the RF, LO and IF ports were balanced, which had + and − signal and gate biases (less than threshold voltage: −4.5V) provided through 1000 Ohm resistors. Both the standard prior art mixer and a mixer according to the present invention had shunt resistor (1000 Ohm) termination at the RF and IF that acted like a DC current path to the ground. In a large signal swing condition, an undesired DC current can be generated through non-linear harmonic distortion and such a DC current can shift the device's bias point and may cause undesired performance. Since each design sought the best IIP3 and conversion loss in a given architecture, each device's size, transmission lines and matching condition differed between the two designs, resulting in different chip sizes.

Figure 4:
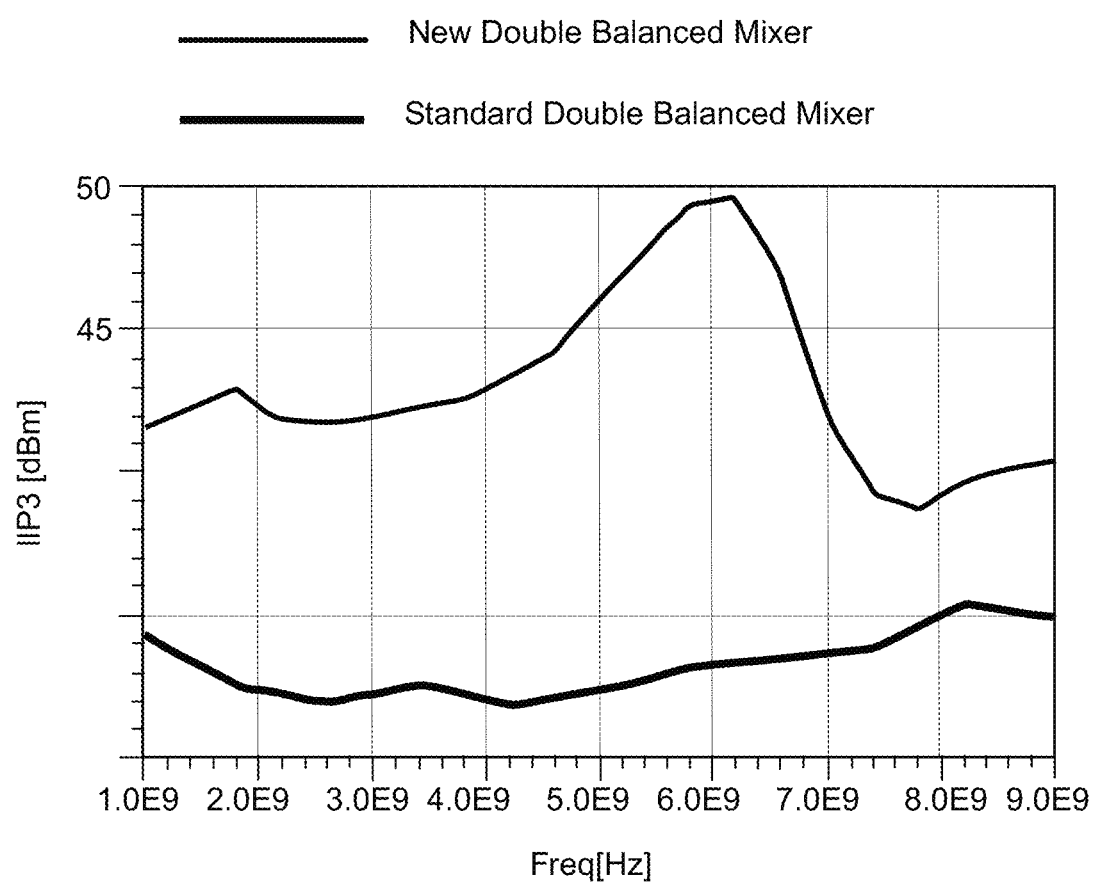
FIG. 4 is a diagram showing a relationship between IIP3 and frequency.
Figure 5:
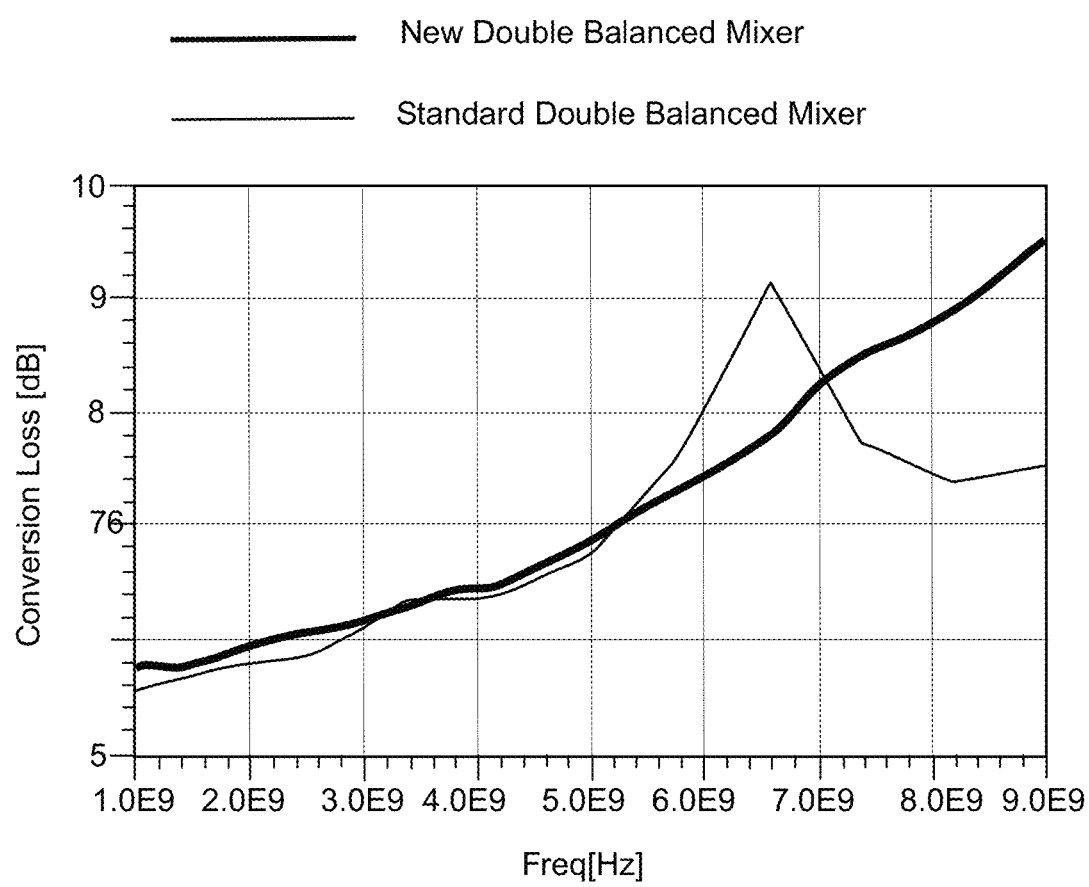
FIG. 5 is a diagram showing the relationship between conversion loss and frequency.

FIGS. 4 and 5 show the simulation comparisons for IIP3 and conversion loss of some examples between standard prior art mixer and the mixer according to the present invention. For the simulation purposes, RF frequency was swept from 1 GHz to 9 GHz and IF frequency was selected at 0.5 GHz.

As shown in FIG. 4's IIP3 results, the mixer according to the present invention can outperform the standard prior art mixer by 5 to 15 dB of IIP3. The mixer according to the present invention effectively suppressed the third harmonic by about 10 dB more than standard mixer. FIG. 5 shows the conversion loss of the mixer according to the present invention and the standard mixer.

Figure 7:
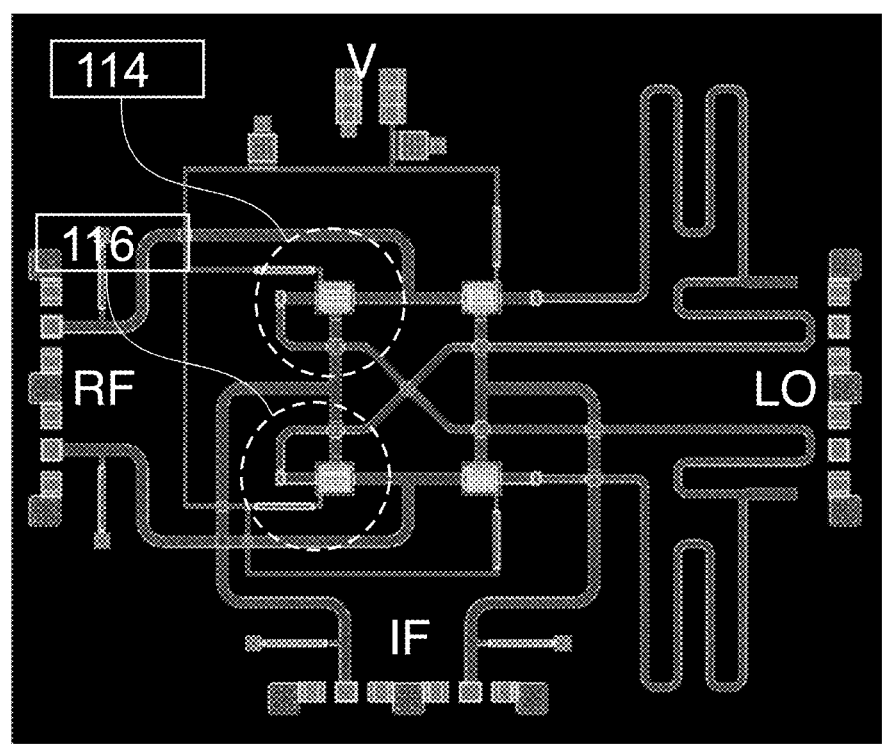
FIG. 7 depicts a mixer made using the circuit of FIG. 1.
Figure 8:
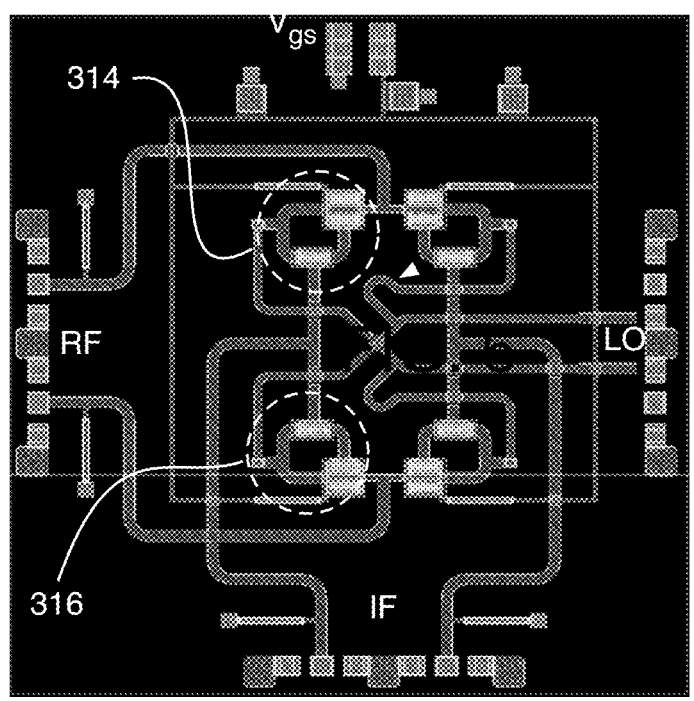
FIG. 8 depicts a mixer made using the circuit of FIG. 3.

FIGS. 7 and 8 show layout examples of conventional and invented double-balanced resistive mixer using GaN HEMTs. The gate with sizes are 720 um for the standard prior art mixer and gate widths of 420 um and 840 um for 312 and 310 respectively. The total chip sizes are 3.6 mm×2.9 mm for the standard prior art mixer and 2.6 mm×2.7 mm for the 312 and 310 devices. Since they both use a double-balanced architecture, the RF, LO and IF ports are the balanced type, which have plus and minus signal pads. Gate biases are provided through TaN resistors. Both the standard prior art mixer and the invented mixer have shunt resistor termination at the RF and IF probe pads that act like a DC current path to the ground. In a large signal swing condition, undesired DC current is generated through non-linear harmonic distortion and such DC current shifts device bias point and brings undesired performance. Since each design attempts to achieve the best IIP3 and conversion loss in a given architecture, device sizes, transmission lines, and matching conditions are different between the two designs, resulting in different chip sizes.

It should be noted that the series connected active devices in a unit cell can be implemented fairly easily with little or not expansion of surface area.

Figure 9A:
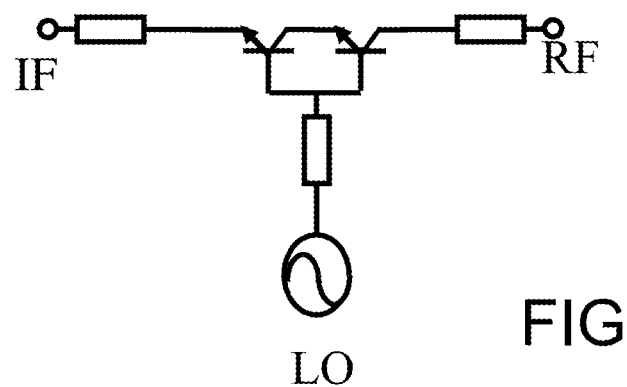
FIG. 9a is similar to FIG. 2a but shows a circuit diagram of two bipolar transistors (BJTs) connected in series in a unit cell.
Figure 9B:
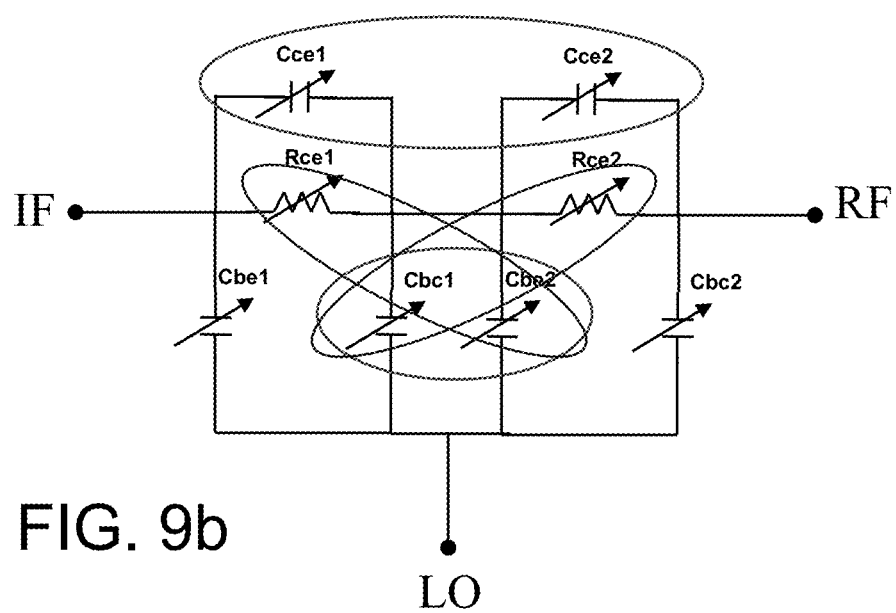

FIG. 9a is similar to FIG. 2a but shows a circuit diagram of two bipolar transistors (BJTs) connected in series in a unit cell 212 while FIG. 9b presents an equivalent circuit for the circuit schematic of FIG. 9a.

The size ratio described herein is in term of the relative sizes of a semiconductor element of a pair of active devices. The semiconductor element in the case of FETs is the gate and the size ratio is based on gate widths as defined in FIG. 6. The semiconductor element in the case of bipolar transistors is the emitter and the size ratio is based on emitter areas.

While the ratio described herein is in terms of the relative sizes of semiconductor element of a pair of active devices, it may well be possible to characterize this ratio in terms of the relative transconductances of the two devices as opposed to just the sizes of a semiconductive element thereof.

While certain features have been described herein, many other features are contemplated and fall within the scope of the disclosure.

All elements, parts and steps described herein are preferably included. It is to be understood that any of these elements, parts and steps may be replaced by other elements, parts and steps or deleted altogether.

What is claimed is:

1. An apparatus for reducing a third harmonic of an RF signal in a mixer comprising a plurality of unit cells, the unit cells being connected in a ring of unit cells having an RF input, a LO input and an IF output, the apparatus comprising:

at least a pair of active devices disposed in each of said unit cells, each of said pair of active devices having a pair of current carrying electrodes and at least one control electrode;

a first circuit connecting the at least a pair of active devices in each of said unit cells so that said current carrying electrodes of the active devices in each unit cell are coupled in series with each other and also connected to current carrying terminals of neighboring unit cells in said ring of unit cells;

a second circuit connecting the at least a pair of active devices in each of said unit cells so that their control electrodes are coupled in parallel with each other and also connected to said LO input;

and wherein sizes of at least one semiconductor element in each of the pair of active devices in each of said unit cells being differently sized relative to each other in said unit cells.

2. The apparatus of claim 1 wherein a dimension of the semiconductor element in each of the pair of active devices said unit cells that are differently sized is a width dimension of a gate of each of the pair of active devices in said unit cells.

3. The apparatus of claim 1 wherein the size of the semiconductor element in each of the pair of active devices in each of said unit cells which are differently sized is an area of an emitter of each of the pair of active devices in each of said unit cells.

4. The apparatus of claim 1 wherein the mixer comprises four unit cells disposed in said ring, the RF input being coupled to one of the current carrying electrodes of the pair of active devices of each of the four unit cells and the IF output being coupled to another one of the current carrying electrodes of the pair of active devices of each of the four unit cells.

\* \* \* \* \*